United States Patent [19]

Tuhy, Jr.

[11] Patent Number: 4,649,298
[45] Date of Patent: Mar. 10, 1987

[54] NON-SATURATING TRI-STATE DRIVER CIRCUIT

[75] Inventor: Frank P. Tuhy, Jr., Montville, N.J.

[73] Assignee: AT&T Bell Laboratories, Murray Hill, N.J.

[21] Appl. No.: 689,951

[22] Filed: Jan. 9, 1985

[51] Int. Cl.⁴ ........................................... H03K 19/013
[52] U.S. Cl. ..................................... 307/473; 307/443; 307/454; 307/455; 307/300
[58] Field of Search .................... 307/200 A, 443, 446, 307/454, 455, 473, 475, 491, 494–496, 355–356, 542, 549, 254, 591, 300, 296 R, 459, 477

[56] References Cited

U.S. PATENT DOCUMENTS

| Re. 29,982 | 5/1979 | Aoki | 307/473 |
|---|---|---|---|
| 3,792,292 | 2/1974 | Priel | 307/473 |
| 4,110,641 | 8/1978 | Payne | 307/355 |
| 4,363,978 | 12/1982 | Heimbigner | 307/473 X |
| 4,376,900 | 3/1983 | Metzger | 307/473 |
| 4,380,080 | 4/1983 | Rattlingourd | 307/473 |
| 4,418,290 | 11/1983 | Nagano | 307/355 |
| 4,471,237 | 9/1984 | Kaplan | 307/443 |
| 4,504,745 | 3/1985 | Spence et al. | 307/473 |
| 4,567,384 | 1/1986 | Stuhlmiller | 307/443 X |

Primary Examiner—Stanley D. Miller
Assistant Examiner—D. R. Hudspeth
Attorney, Agent, or Firm—Patrick E. Roberts; Robert O. Nimtz; Charles Scott Phelan

[57] ABSTRACT

A single chip, bipolar logic circuit receives input signals in a differential amplifier or comparator stage coupled, without saturation, by differential current mirrors to drive an output stage of the push-pull variety. Various circuit arrangement are included to keep other bipolar transistors out of their saturation operating regions, and master transistors of the current mirror are provided with trickle bias when in the operating state to hold them at turn-on threshold for fast response to changes in state of the digital signals.

7 Claims, 6 Drawing Figures

NON-SATURATING TRI-STATE DRIVER CIRCUIT

TECHNICAL FIELD

This invention relates to the use of buried injection logic circuitry on analog integrated circuits and, in particular to tri-state driver circuits which are restricted to non-saturating devices in order to achieve fast operational speeds.

BACKGROUND OF THE INVENTION

Buried injection logic (BIL) circuits are a type of logic circuits which can be implemented on bipolar analog integrated circuits. The characteristics include low voltage, low power, medium speed, and compact size. These circuits permit mixing of analog and digital functions on a single chip. Because these circuits have low power and low voltage, however, they cannot drive external circuits directly but require some type of buffer.

Furthermore, use of conventional digital type gates on analog integrated circuits results in exclusive propagation delays. It is desirable to derive a buffer logic which has few stages so that the propagation delays are minimized. One solution to this problem in the prior art called for comparing the low voltage BIL signal with a reference voltage. Whereas the low voltage BIL signal had a wide tolerance for variations in voltage swings, the reference voltage (also known as threshold voltage or switching point reference) could not track the variations in the low voltage input.

SUMMARY OF THE INVENTION

In accordance with the present invention, there is disclosed an improved tri-state driver circuit, wherein the improvement comprises, in combination, the following: (1) the use of low voltage signal and its complement (instead of the low voltage signal plus a reference voltage) to drive a differential comparator or differential amplifier. The use of the complement eliminates the sensitivity to the absolute level of the low voltage signal input; (2) the use of trickle currents to minimize voltage swings in the driver, thereby reducing the time taken to turn the circuit ON or OFF; (3) the use of an anti-saturation device which minimizes the storage time taken by the output transistor that provides the logical "1" output; (4) a level shifting circuit used to prevent the voltage swings at the output bus from going below ground for the logical "0" output; and (5) the use of a steered current source to turn the differential comparator, or differential amplifier, OFF in order to provide the high impedance output state. The logical "1", the logical "0", and the high impedance states comprise the three output states.

DETAILED DESCRIPTION

Figure 1:
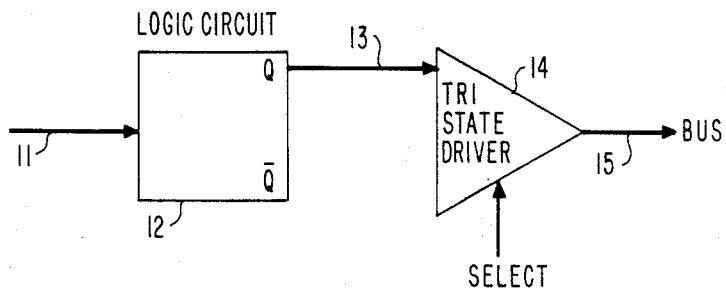
FIGS. 1, 2 and 3 show prior art tri-state driver circuits.

Referring to the prior art circuit of FIG. 1, there is shown a flip-flop 12 receiving its input on lead 11 from other logic (not shown). The output from the Q port is fed to a tri-state driver 14 which is used to drive bus 15.

Figure 2:
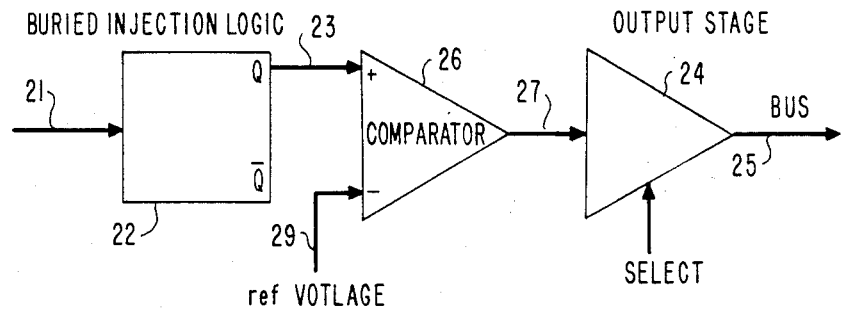

Referring to the improved prior art circuit of FIG. 2, for use with buried injection logic (BIL) there is shown the use of comparator 26 introduced between the Q port of flip-flop 22 and the tri-state driver 24. The low voltage signal from the Q port of flip-flop 22 is compared with a reference voltage on lead 29. A problem with this improvement arises with the voltage variations in either the reference voltage on lead 29 or the low voltage logic levels on lead 23.

Figure 3:
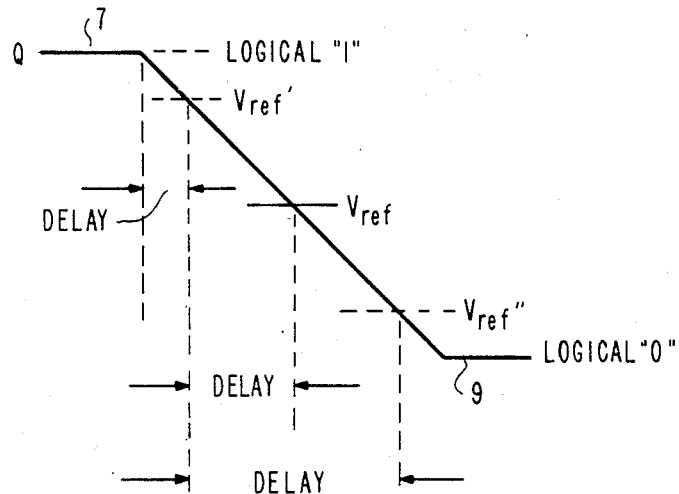

Referring to FIG. 3, when the reference voltage $V_{ref}$ (with respect to the low voltage signal) changes to $V_{ref'}$, the propagation delay of the low voltage signal from the Q port to the comparator output is reduced to DELAY'. When the voltage changes to $V_{ref''}$, the propagation delay increases to DELAY''. Such propagation delay variations can result in delays outside the desired limits. If the effective value of $V_{ref}$ falls outside the limits bounded by lines 7 and 9, the circuit ceases to function.

Figure 4:
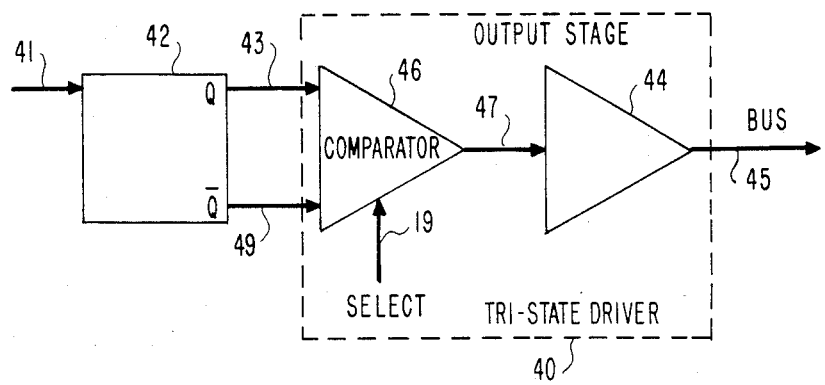
FIGS. 4 and 5 show the basic concepts of the present invention.
Figure 5:
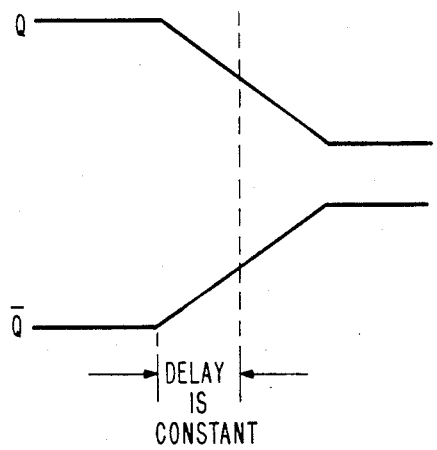

Referring to FIG. 4, there is shown the basic components embodying the present inventive concept. The low voltage output signals from both the Q and the $\overline{Q}$ ports are fed to comparator 46 prior to delivery to the output stage 44 of the tri-state driver 40. The advantage of using the low voltage output signals from both ports can be seen by referring to FIG. 5. Whenever there is a change from one port to another, the comparator state occurs at the point where Q equals $\overline{Q}$ and the delay is constant for a fixed output level swing in Q and $\overline{Q}$. When the select lead 19 to the operation is independent of the absolute value of Q and $\overline{Q}$, comparator 46 is a zero, there is no output to bus 45; instead, there is a high impedance. Operation is independent of the absolute value of Q and $\overline{Q}$. When the select lead 19 to comparator 46 is a zero, there is no output to bus 45; instead, there is a high impedance. The three states are thus derived.

Figure 6:
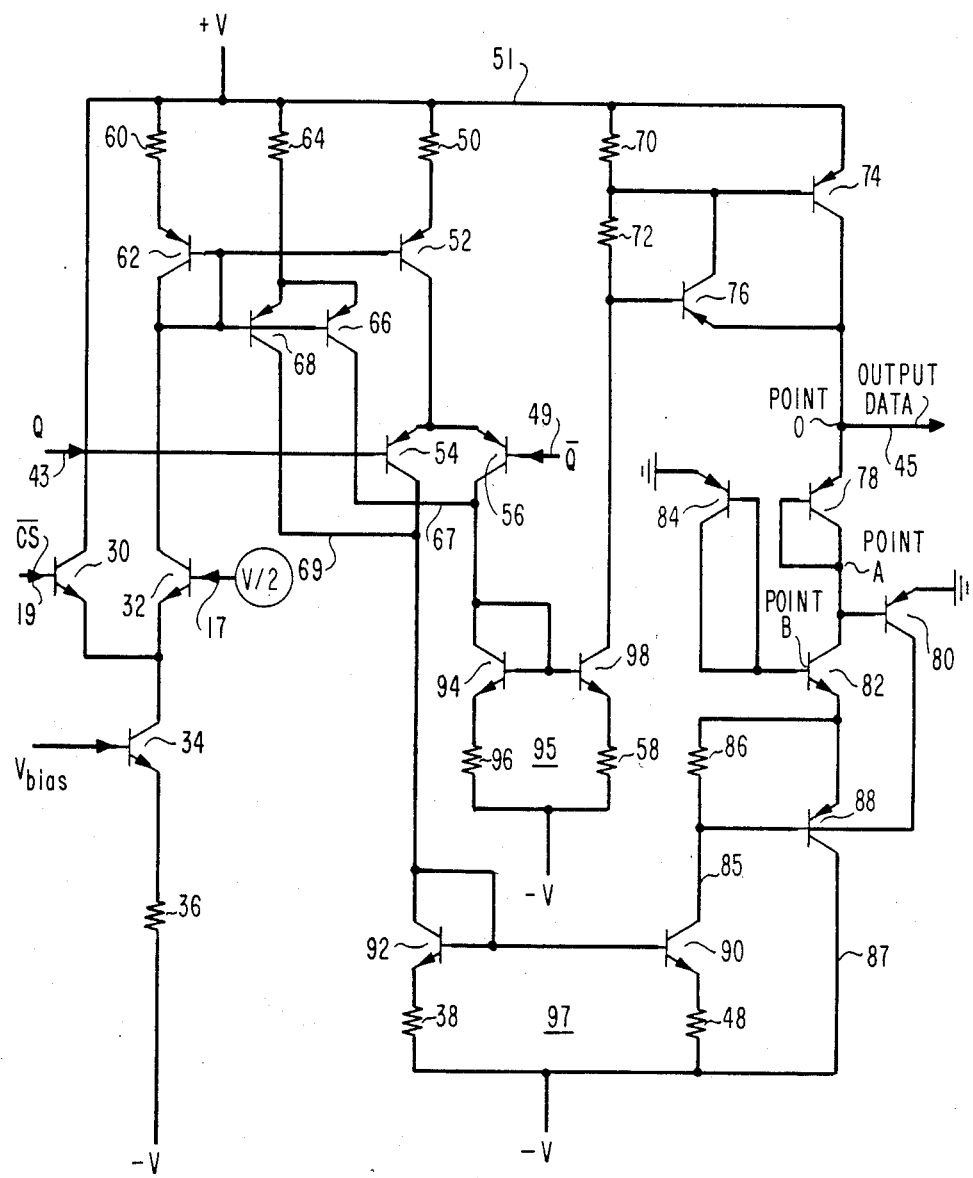
FIG. 6 shows the preferred embodiment of the present invention.

Referring to FIG. 6, there is shown the preferred embodiment of the present invention in bipolar integrated circuit technology. Resistor 50, transistor 52, transistor 54 and transistor 56 together form the comparator section. When transistor 52 is biased, to be described hereinbelow, resistor 50 and transistor 52 together form a current source for providing constant current to the emitters of transistors 54 and 56. Transistors 54 and 56 form the comparator or differential amplifier stage. The base electrodes of transistors 54 and 56 are biased by the low voltage output signals from the Q and the $\overline{Q}$ ports, respectively, from a device such as flip-flop 42 of FIG. 4. When the low voltage output from the Q port is more positive than that from the $\overline{Q}$ port, current flows through the emitter-collector path of transistor 56. Likewise, when the low voltage signal from the $\overline{Q}$ port is more positive than that from the Q port, current from the current source flows through the emitter-collector path of transistor 54.

Resistor 64 and transistors 68 and 66 are used to supply a trickle current to the output from transistors 54 and 56. The trickle current minimizes the voltage swings at the output from transistors 54 and 56. Because delay through current mirrors 95 and 97 is proportional to these voltage swings, the use of a trickle current reduces this delay.

Transistors 94 and 98 and resistors 96 and 58 form a first current mirror 95. Likewise, transistors 92 and 90 and resistors 38 and 48 form a second current mirror 97.

Resistors 70 and 72 and transistors 74 and 76 form the section which provides the logical "1" output from the driver to bus 45. As is known, there are two components to delay: ramp time caused by internal circuit capacitance for turning the circuit ON or OFF, and the storage time in the transistors themselves. In order to minimize the storage time in the transistors, it is necessary to insure that they are not saturated. Thus, in order to keep output transistor 74 from reaching saturation, anti-saturation transistor 76 is provided and resistor 70 discharges the base current flow when transistor 74 is turned OFF. Resistor 72 is selected so as to maintain a voltage drop across the emitter-collector path of output transistor 74 and prevent it from being saturated.

When the output from $\overline{Q}$ is more positive than that from Q, transistor 90 is turned ON to provide the logical "0" output. Together, output transistors 74 and 82 form a push-pull type output stage. When transistor 90 is turned ON, the output point 0 is at ground, but never below ground. This is made possible by this level shifting output stage comprised of transistors 84 and 78, which are connected as diodes, transistors 80, 82, 88 and resistor 86. Point B is a diode drop below ground when transistor 90 is ON. Transistor 80 limits point A to a diode drop below ground. Because both points A and B are at the same voltage level, transistor 82 never saturates.

One of the functions performed by transistor 80 is that of a voltage limiter. It does this by limiting the voltage swing at point A when point 0 reaches ground level because of the emitter-base drop of transistor 80. Transistor 80 also limits the over all current through transistors 78 and 82 at point 0 by causing a bypass of the current which flows into the base of transistor 88 to flow through the emittercollector path of transistor 80 if point A tries to pull too hard. Transistor 82 provides a collector type output to data bus 45 when the output from transistor 90 is OFF.

In response to a chip select signal on lead 19, transistor 30 is powered OFF or ON, respectively, which functions to steer the current from current source transistor 34 such that current source transistor 52 is turned ON or OFF. Transistors 62 and 52 form a current mirror. Transistor 34 and resistor 36 form a current source. This current is caused to flow through transistors 32,62 and 52, when transistor 30 is turned OFF. When transistor 30 is ON, the current from transistor 34 flows through transistor 30 and transistors 32, 62 and 52 are turned OFF. Thus the chip select does the function of turning the circuit ON and OFF. A 0 on chip select lead 19 turns the circuit ON and a 1 on chip select lead 19 turns the circuit OFF.

Transistors 30 and 32 form a comparator. When the chip select voltage on lead 19 exceeds the voltage on lead 17 (that is, when there is a 1 on lead 19), current flows through transistor 30, no current flows through transistor 32 and the circuit is OFF. That is, there is no signal to drive transistors 90, 82, 98 or 74; therefore, there is no output drive to bus 45 and the impedance is high at point 0.

When the chip select voltage on lead 19 goes low, that is, below the voltage on lead 17 (that is, when there is a 0 on lead 19), current is steered through the collector-emitter path of transistor 32 which turns transistor 62 ON. When transistor 62 is turned ON, transistor 52 is turned ON. When the low voltage from the Q port is more positive than that from the $\overline{Q}$, transistor 98 is turned ON thereby causing the output transistor 74 to be turned ON for delivery to output bus 45 of a high level logical "1" in response to the low level logical "1" issued from the Q port. If the low voltage from the $\overline{Q}$ exceeds that from the Q port, then transistor 90 is turned on and the output at point 0 on bus 45 is a high level logical "0" in response to the low level logical "0" from the Q port.

What is claimed is:

1. An improved non-saturating tri-state driver circuit comprising a source of low voltage signals, a comparator and an output stage for delivering a tri-state signal all connected in cascade, wherein the improvement comprises
   first and second means each connected between said source of low voltage signals and said comparator for delivering said low voltage signals and the complement of said low voltage signals from said source of low voltage signals to said comparator.

2. The driver of claim 1 wherein said comparator has at least one output lead said driver further comprising means for delivering a trickle current to the output leads from said comparator so that the time taken to turn said driver ON or OFF is minimized by reducing the voltage swings at the output from said comparator, said means for delivering a trickle current being connected between a voltage supply and the comparator output lead.

3. The driver of claim 1 wherein said output stage comprises an output bus, said driver further comprising
   a power supply,
   an output transistor, said output transistor connected between said power supply and said output bus, and
   means for preventing the output transistor from reaching saturation.

4. The driver of claim 1 further comprising means for shifting the output level to ground potential in response to the output from said comparator.

5. The driver of claim 4 further comprising means for limiting the voltage swings at said output bus by causing the current flow through said limiting means to be changed.

6. The driver of claim 1 further comprising means for turning said driver ON or OFF by controlling a current source which biases said comparator, said current source being connected between said comparator and a voltage supply.

7. A tri-state non-saturating driver circuit comprising means for turning said circuit ON or OFF,
   means for receiving low voltage signals and the complement of said low voltage signals and for comparing said low voltage signals and its complement,
   means responsive to said means for turning said circuit ON or OFF for causing said comparator either to turn ON an output stage so that said low voltage signals are presented as high level logical ones or zeros to an output bus or to turn off the comparator and output stages so that there is presented to said output bus a high impedance, and
   means for providing trickle currents to a pair of current mirrors which are connected between the output from said comparator and said output stage to reduce the time taken to turn said driver ON or OFF.

* * * * *